US009029847B2

United States Patent
Lee et al.

(10) Patent No.: US 9,029,847 B2
(45) Date of Patent: May 12, 2015

(54) ORGANIC LIGHT EMITTING DIODE DISPLAY DEVICE AND METHOD OF FABRICATING THE SAME

(71) Applicant: LG Display Co., Ltd., Seoul (KR)

(72) Inventors: Sun Hee Lee, Goyang-si (KR); Jung Yeon Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/043,436

(22) Filed: Oct. 1, 2013

(65) Prior Publication Data

US 2014/0117333 A1    May 1, 2014

(30) Foreign Application Priority Data

Oct. 30, 2012 (KR) .................. 10-2012-0120917
Jul. 31, 2013  (KR) .................. 10-2013-0090779

(51) Int. Cl.
  *H01L 51/52* (2006.01)
  *H01L 27/32* (2006.01)
  *H01L 51/56* (2006.01)

(52) U.S. Cl.
  CPC ........ *H01L 51/5253* (2013.01); *H01L 27/3241* (2013.01); *H01L 51/56* (2013.01); *H01L 51/5246* (2013.01); *H01L 27/32* (2013.01)

(58) Field of Classification Search
  CPC . H01L 51/5246; H01L 51/5253; H01L 27/32; H01L 27/3241
  USPC ........................................ 257/40, 99; 438/34
  See application file for complete search history.

(56) References Cited

U.S. PATENT DOCUMENTS

| 8,786,180 | B2 * | 7/2014 | Song et al. ..................... 313/504 |
| 2008/0078993 | A1 * | 4/2008 | Cho et al. ........................ 257/40 |
| 2013/0056736 | A1 * | 3/2013 | Kim et al. ....................... 257/59 |

* cited by examiner

*Primary Examiner* — Allan R Wilson
(74) *Attorney, Agent, or Firm* — Brinks Gilson & Lione

(57) ABSTRACT

An organic light emitting diode display device is disclosed. The organic light emitting diode display device includes: an element substrate configured to include a plurality of pixel regions; a first passivation layer formed on the element substrate; an organic light emitting diode which includes a first electrode formed on the first passivation layer, a first insulation film formed on the first passivation layer with the first electrode and configured to define an emission region, and an organic layer and a second electrode formed on the first insulation film; a first fixed layer formed on the first passivation layer under an edge of the insulation film and configured to prevent a direct contact of the first passivation layer and the edge of the first insulation film; and a second passivation layer formed on the organic light emitting diode.

22 Claims, 11 Drawing Sheets

ORGANIC LIGHT EMITTING DIODE DISPLAY DEVICE AND METHOD OF FABRICATING THE SAME

The present application claims priority under 35 U.S.C. §119(a) of Korean Patent Application No. 10-2012-0120917 filed on Oct. 30, 2012, and Korean Patent Application No. 10-2013-0090779 filed on Jul. 31, 2013, which are hereby incorporated by reference in its entirety.

BACKGROUND

1. Field of the Disclosure

The present application relates to an organic light emitting diode display device. More particularly, the present application relates to an organic light emitting diode display device adapted to block an intrusion path of external moisture and to a method of fabricating the same.

2. Description of the Related Art

The organic light emitting diode devices are self-illuminating display devices. As such, the organic light emitting diode devices do not need any separate light source, unlike a liquid crystal display device. In accordance therewith, the organic light emitting diode display devices can become lighter and thinner. Also, organic light emitting diode display devices have the features of wider viewing angle, superior contrast, and lower power consumption than those of liquid crystal display devices. Moreover, organic light emitting diode display devices can be driven by a low direct-current voltage and provide a high speed response. Furthermore, organic light emitting diode display devices can well resist external impacts and be used in a wide temperature range because of having solid components.

In organic light emitting diode display devices, external oxygen and moisture may cause damage on some electrodes. External oxygen and moisture may deteriorate a lifespan of organic light emitting diode display devices. Therefore, it is very important to package an organic light emitting element and avoid exposure to external oxygen and moisture.

As a packaging method, an entire surface sealing process can be used in organic light emitting diode display devices. In the entire surface sealing process, an element substrate provided with organic light emitting diodes can be bonded to a sealing substrate by means of a sealant which is formed on the entire surfaces of the element substrate and the sealing substrate. The conventional basic structure of organic light emitting diode display devices will now be described referring to FIGS. 1 and 2.

Figure 1:
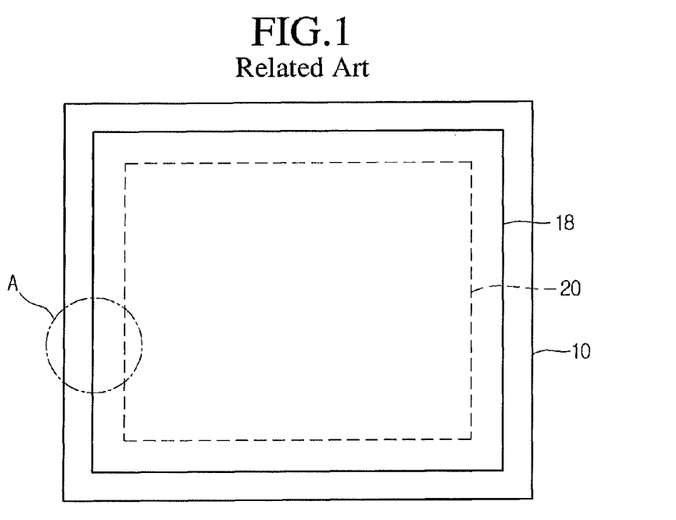
FIG. 1 is a plan view showing an organic light emitting diode display device of the related art.

FIG. 1 is a planar view showing an organic light emitting diode display device of the related art. Referring to FIG. 1, organic light emitting diodes 20 are formed on an element substrate 10. Each of the organic light emitting diodes 20 can include a first electrode, an organic layer configured to include at least a light emission layer, and a second electrode. Moreover, thin film transistors (not shown) each include a semiconductor layer, a gate electrode, a source electrode and a drain electrode can be formed on the element substrate 10. Subsequently, a sealing layer can be formed between the element substrate 10 and a sealing substrate 18. The element substrate 10 and the sealing substrate 18 can be bonded by means of the sealing layer. The sealing layer can include a second passivation layer and an adhesive layer. Such an organic light emitting diode display device can be described referring to a cross-sectional view which shows an edge portion "A" of the substrates 10 and 18.

Figure 2:
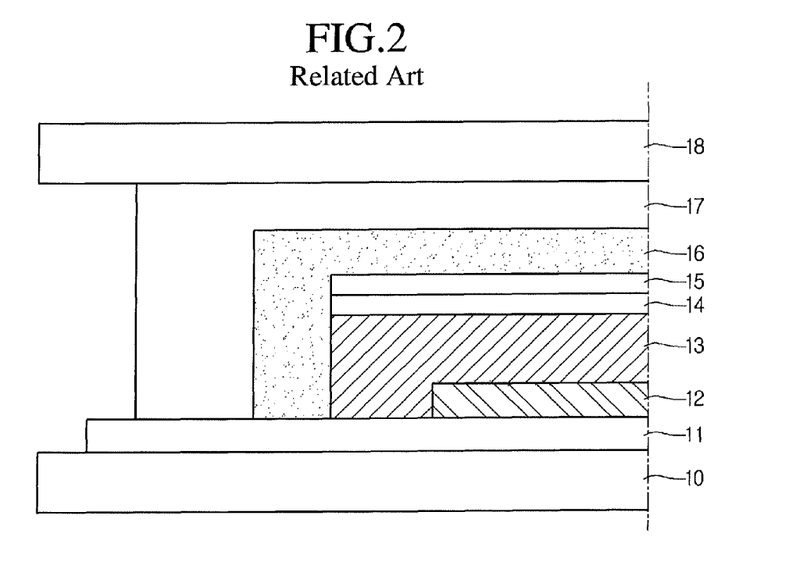
FIG. 2 is a cross-sectional view showing an organic light emitting diode display device of the related art.

FIG. 2 is a cross-sectional view showing an organic light emitting diode display device of the related art. As shown in FIG. 2, a first passivation layer 11 is formed on the element substrate 10. The first passivation layer 11 is used to protect thin film transistors, among others. Also, first electrodes 12 of the organic light emitting diodes are formed on the first passivation layer 11. Moreover, an insulation film 13 defining emission regions is formed on the first passivation layer 11. The emission regions expose the first electrodes 12. Further, an organic layer 14, which is configured to include an emission layer, and a second electrode 15 are applied on the insulation film 13 and the exposed first electrodes 12. The first electrode 12, the insulation film 13, the organic layer 14 and the second electrode 15 form an organic light emitting diode. Furthermore, a second passivation layer 16 is formed on the organic light emitting diodes, particularly on the second electrode 15. The second passivation 16 is formed in such a manner as to encompass the elements on the element substrate 10 to protect the elements on the element substrate 10 against, for example, moisture, gas. Finally, an adhesive layer 17 is formed on the exposed surfaces of the second passivation layer 16. The sealing substrate 18 is bonded to the element substrate 10 by means of the adhesive layer 17, thereby completing an organic light emitting diode display device.

Figure 14A:
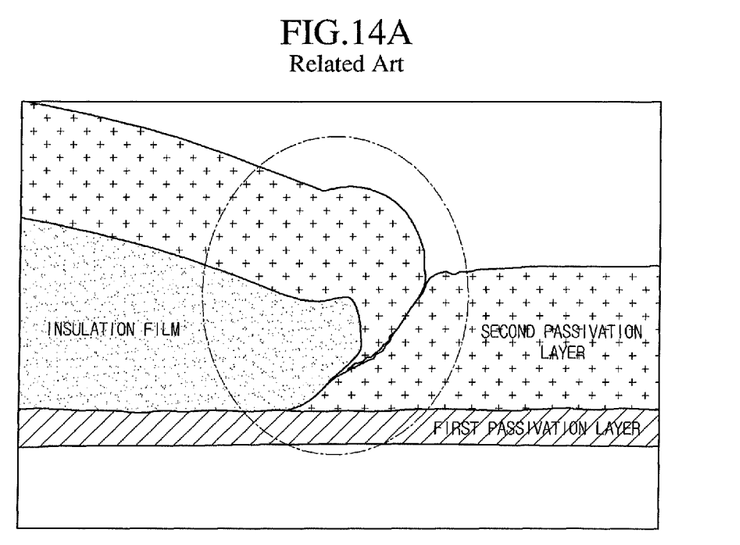
FIG. 14A illustrates one example of an experimental resultant for a rolling phenomenon which is generated in an organic light emitting diode display device of the related art.

FIG. 14A illustrates an experimental resultant for a rolling phenomenon which is generated in an organic light emitting diode display device of the related art including the device as shown in FIG. 2.

Referring to FIGS. 2 and 14A, the organic light emitting diode has a weak interfacial adhesion force between the insulation film 13 and the first passivation layer 11. As such, the insulation film 13 can roll up. The rolling of the insulation film 13 causes a portion of the second passivation layer 16 to separate from a side surface of the insulation film 13, thereby generating cracks as shown in FIG. 14A. As such, the cracks generated in the second passivation layer 16 may serve as intrusion paths for external moisture, gas, among others.

BRIEF SUMMARY

Accordingly, embodiments of the present application are directed to an organic light emitting diode display device and to a method of fabricating the same which substantially obviates one or more of problems due to the limitations and disadvantages of the related art.

According to one embodiment, an organic light emitting diode display device includes: an element substrate configured to include a plurality of pixel regions; a first passivation layer formed on the element substrate; an organic light emitting diode which includes a first electrode formed on the first passivation layer, a first insulation film formed on the first passivation layer with the first electrode and configured to define an emission region, and an organic layer and a second electrode formed on the first insulation film; a first fixed layer formed on the first passivation layer under an edge of the insulation film and configured to prevent a direct contact of the first passivation layer and the edge of the first insulation film; and a second passivation layer formed on the organic light emitting diode.

In another embodiment, a method of fabricating an organic light emitting diode display device according to a second general aspect of the present embodiment includes: forming an element substrate configured to include a plurality of pixel regions; forming a first passivation layer on the element substrate; forming a first electrode of an organic light emitting diode on the first passivation layer; forming a first fixed layer on the first passivation layer; forming a first insulation film on the first passivation layer provided with the first electrode and the first fixed layer; forming an organic layer on the first insulation film; forming a second electrode of the organic light emitting diode on the organic layer; and forming a second passivation layer on the element substrate provided with the second electrode. The first fixed layer is positioned under an edge of the first insulation film and prevents a direct contact between the edge of the first insulation film and the first passivation layer.

The above-described embodiments may provide an organic light emitting diode display device and a fabricating method thereof that are adapted to prevent a rolling phenomenon of an insulation film by forming a fixed layer under an edge of the insulation film. Also, the embodiments may provide an organic light emitting diode display device and a fabricating method thereof that are adapted to enhance a contractive property by preventing a rolling phenomenon of an insulation film and a crack generation in a second passivation layer.

Moreover, the above-described embodiments may provide an organic light emitting diode display device and a fabricating method thereof that are adapted to block an intrusion path of external moisture by forming a fixed layer under an edge of an insulation film.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION OF THE EMBODIMENTS

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

Figure 3:
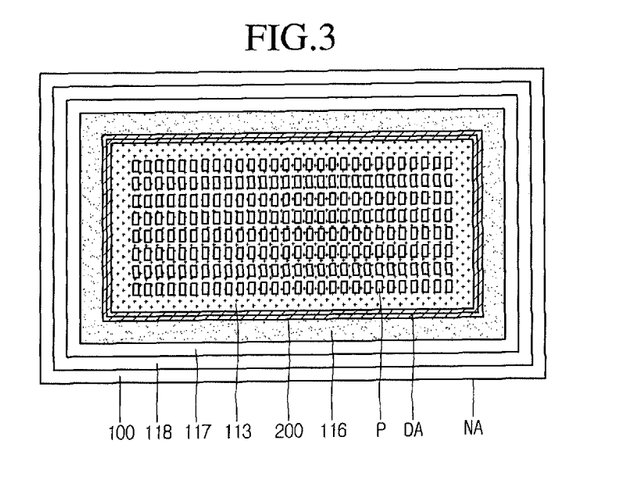
FIG. 3 is a plan view showing an organic light emitting diode display device according to a first embodiment of the present disclosure.

FIG. 3 is a planar view showing an organic light emitting diode display device according to a first embodiment of the present disclosure. Referring to FIG. 3, the organic light emitting display device according to a first embodiment of the present disclosure includes an element substrate 100 and a sealing substrate 118 which are combined with each other with having an adhesive layer 117 therebetween. The element substrate 100 can be defined into a plurality of pixel regions P. An insulation film 113 is formed on the element substrate 100. The insulation film 113 can partially expose a first electrode of an organic light emitting diode and define the pixel region P.

The element substrate 100 can be defined into a display area DA and a non-display area NA. The display area DA is defined into the plurality of pixel regions P and covered with the insulation film 113. The non-display area NA can be defined as an outer area surrounding the display area DA.

A fixed layer 200 is formed under the insulation film 113. The fixed layer 200 is formed in direct contact with the insulation film 113. More specifically, the fixed layer 200 can be formed under the edge of the insulation film 113. In other words, the edge of the insulation film 113 corresponds to a boundary of the display area DA and the non-display area NA. Consequently, the fixed layer 200 positioned under the edge of the insulation film 113 can be formed in a closed loop and surround the display area DA.

More specifically, a part of the fixed layer 200 can be formed in such a manner as to overlap with the insulation film 113, and the rest of the fixed layer 200 can be formed to expand outwardly from the edge of the insulation film 113. In other words, the fixed layer 200 can be formed in inner and outer areas of the edge of the insulation film 113. Consequently, the fixed layer 200 can be formed in both of the display and non-display areas DA and NA. A second passivation layer 116 is formed on the insulation film 113 under which the fixed layer 200 is formed. The second passivation layer 116 can be formed to expand in such a manner as to overlap with the fixed layer 200 which is formed in the non-display area NA. Such an organic light emitting diode display device according to a first embodiment of the present disclosure will now be described in detail referring to a cross-sectional view.

Figure 4:
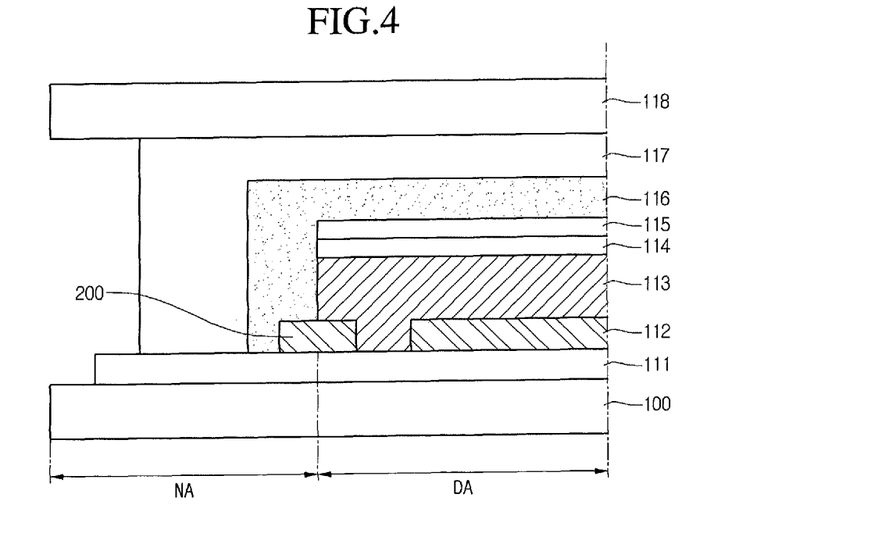
FIG. 4 is a cross-sectional view showing an organic light emitting display device according to a first embodiment of the present disclosure.

FIG. 4 is a cross-sectional view showing an organic light emitting diode display device according to the first embodiment of the present disclosure as shown in FIG. 3. Referring to FIG. 4, the organic light emitting diode display device according to the first embodiment of the disclosure includes the first passivation layer 111 formed on the element substrate 100. The element substrate 100 includes a display area which defines a plurality of pixel regions. Such the element substrate 100 can become an insulation substrate which is formed from one of an insulation glass, an insulating material, a plastic material, polyimide PI, among others. Also, the organic light emitting diode display device includes thin film transistors and pixel electrodes electrically connected to the drain electrodes of the thin film transistors. Each of the thin film transistors includes a gate electrode, a semiconductor layer and source/drain electrodes.

Organic light emitting diodes are formed on the first passivation layer 111. Each of the organic light emitting diodes includes a first electrode 112, an organic layer 114 including at least an emission layer, and a second electrode 115. The first electrode 112 can be used as an anode of the organic light emitting diode, and the second electrode 115 can be used as a cathode of the organic light emitting diode.

If a predetermined voltage corresponding to a selected color signal is applied between the first and second electrodes 112 and 115 of the organic light emitting diode, holes injected from the anode and electrons injected from the cathode are transported into the organic layer 114 and form excitons. When the excitons are transitioned from an excitation state into a basal state, the excitons emit visible rays. The first electrode 112 can be formed from one material selected from a material group which includes indium-tin-oxide (ITO), indium-zinc-oxide (IZO) and zinc-oxide (ZnO). The second electrode 115 can be formed from one material selected from a material group, which includes magnesium (Mg), calcium (Ca), aluminum (Al), an aluminum alloy, a silver alloy and a gold alloy.

The organic layer 114 can become a single layer formed from an emission material. Alternatively, in order to enhance an emission efficiency, the organic layer is configured to have multi-layers which include a hole injection layer, a hole transportation layer, an emission material layer, an electron transportation layer and an electron injection layer.

An insulation film 113 is formed between the first electrodes 112 and the organic layer 114. The insulation film 113 defines emission regions exposing the first electrodes 112. The emission region corresponds to an exposed portion of the first electrode 112, and the other region covered by the insulation film 113 corresponds to a non-emission region. The organic layer 114 is formed on the first electrode 112 exposed from the insulation film 113.

As discussed above in connection with FIG. 3, the fixed layer 200 is formed on the first passivation layer 111 under an edge of the insulation film 113. The fixed layer 200 can be formed on the first passivation layer 111 under the edge of the insulation film 113. Such a fixed layer 200 can prevent a direct contact of the first passivation layer 111 and the edge of the insulation film 113. As such, the fixed layer 200 can enhance an interfacial adhesion force between the first passivation layer 111 and the insulation film 113. Therefore, a rolling phenomenon of the insulation film 113 can be prevented.

The fixed layer 200 can be formed from a metal oxide material. For example, the fixed layer 200 can be formed from one material selected from a material group which includes indium-tin-oxide (ITO), indium-zinc-oxide (IZO) and zinc-oxide (ZnO). In other words, the fixed layer 200 can be formed from the same material as the first electrode 112. In one embodiment, the fixed layer 200 can be prepared by forming the first electrode 112, which extend to the edge of the lower surface of the insulation film 113, and patterning the first electrode 112.

In another embodiment, the fixed layer 200 can be formed to be separated from the first electrode 112. More specifically, the fixed layer 200 and the first electrode 112 can be formed on the first passivation layer 111 and in the same layer and separated from each other. As such, the first passivation layer 111 and the insulation film 113 can be formed in contact with each other between the first electrode 112 and the fixed layer 200. In other words, the first passivation layer 111 and the insulation film 113 can be separated from each other in the edge of the insulation film 113 by the fixed layer 200, but come in contact with the each other between the fixed layer 200 and the first electrode 112.

A second passivation layer 116 is formed on the first passivation layer 111 and the fixed layer 200. The second passivation layer 116 is used to protect the organic light emitting diodes against moisture, gas, among others. As the rolling phenomenon of the insulation film 113 is prevented by the fixed layer 200, no crack may generate in the second passivation layer 116.

A part of the fixed layer 200 overlaps with the insulation film 113, and in one embodiment, the rest of the fixed layer 200 extend outwardly from the edge of the insulation 113. In other words, the fixed layer 200 can be formed on the display area DA and the non-display area NA in such a manner as to occupy inner and outer regions of the edge of the insulation film 113. In other embodiments, different arrangements of the fixed layer 200 are available.

The organic layer 114 and the second electrode 115 can be sequentially formed only on the insulation film 113. Also, the fixed layer 200 is formed in the inner and outer regions of the edge of the insulation film 113. As such, the fixed layer 200 can come in contact with the second passivation layer 116.

An adhesive layer 117 is formed on the second passivation layer 116. Also, a sealing substrate 118 is bonded to the element substrate 100 by having the adhesive layer 117 disposed therebetween, thereby completing an organic light emitting diode display device. The sealing substrate 118 can be formed from an insulation glass, a metal material or a plastic material. The adhesive layer 117 can include one of a thermosetting adhesive, a thermoplastic adhesive, an ultraviolet curable adhesive, a pressure curable adhesive, among others.

Figure 5:
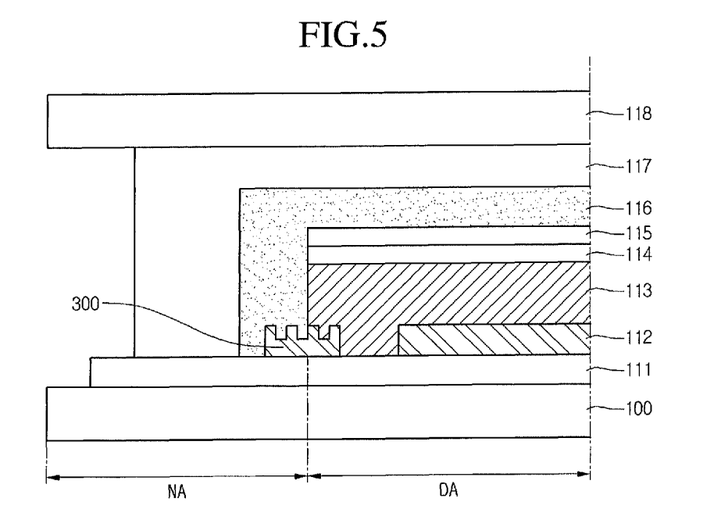
FIG. 5 is a cross-sectional view showing an organic light emitting display device according to a second embodiment of the present disclosure.

FIG. 5 is a cross-sectional view showing an organic light emitting diode display device according to a second embodiment of the present disclosure. The organic light emitting diode display device of the second embodiment has the similar configuration to that of the first embodiment. As such, the description of the second embodiment overlapping with that of the first embodiment is omitted.

Referring to FIG. 5, the organic light emitting diode display device includes a fixed layer 300 with an upper surface of an uneven structure. The uneven structure enlarges or expands the contact area of the fixed layer 300 and the insulation film 113. As such, the adhesive force of the fixed layer 300 and the insulation film 113 can increase, and furthermore the prevention effect of rolling phenomenon can be maximized. The uneven structure can include concave grooves and convex lands. In other words, the uneven structure can include a plurality of slits as shown in FIG. 5.

The fixed layer 300 can be formed in the same layer and material as and from the first electrode 112. The fixed layer 300 and the first electrode 112 can be formed through the same process using the same mask. Similarly to those shown in FIG. 4, the fixed layer 300 and the first electrode 112 can be formed in such a manner as to be separate from each other. Alternatively, the fixed layer 300 and the first electrode 112 can be formed in such a manner as to be connected to each other, like that of the third embodiment which will be described below.

Figure 6:
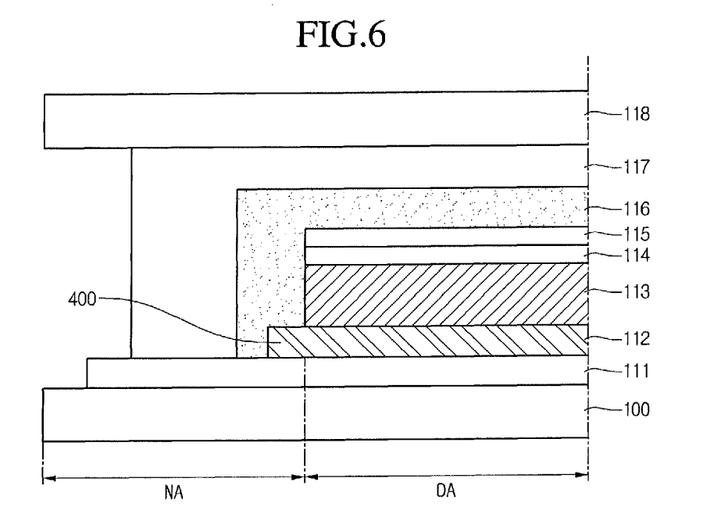
FIG. 6 is a cross-sectional view showing an organic light emitting display device according to a third embodiment of the present disclosure.

FIG. 6 is a cross-sectional view showing an organic light emitting display device according to a third embodiment of the present disclosure. The organic light emitting diode display device of the third embodiment has the similar configuration to that of the first embodiment. As such, the description of the third embodiment overlapping with that of the first embodiment can be omitted.

Referring to FIG. 6, the organic light emitting diode display device according to a third embodiment of the present disclosure includes a fixed layer 400 connected to a first electrode 112. At the formation of the first electrode 112, the fixed layer 400 can be formed by expanding the first electrode 112 to an outward region of the insulation film 113 through the same process as the first electrode 112. In other words, the fixed layer 400 can be formed in the same layer and from the same material as the first electrode 112. Furthermore, the fixed layer 400 positioned under the edge of the insulation film 113 can be formed in an uneven structure, like that of the second embodiment.

Figure 7:
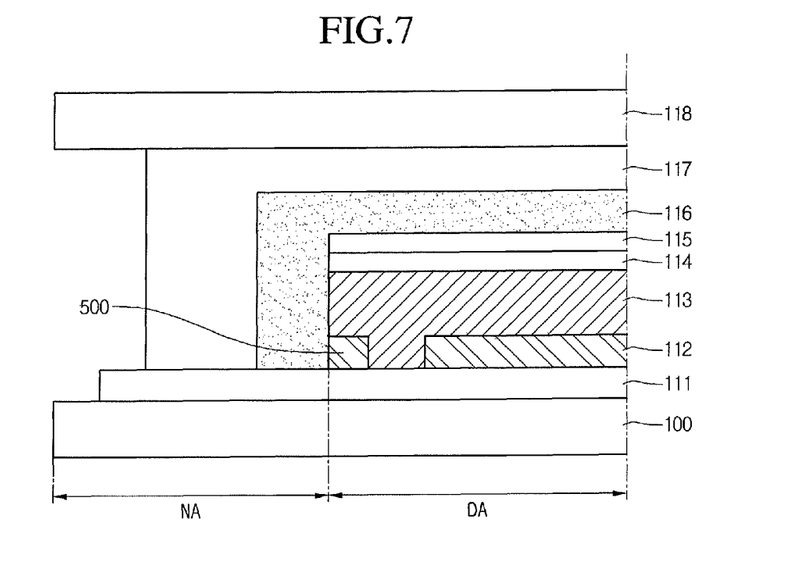
FIG. 7 is a cross-sectional view showing an organic light emitting display device according to a fourth embodiment of the present disclosure.

FIG. 7 is a cross-sectional view showing an organic light emitting display device according to a fourth embodiment of the present disclosure. The organic light emitting diode display device of the fourth embodiment has the similar configuration to that of the first embodiment. As such, the description of the fourth embodiment overlapping with that of the first embodiment is omitted.

Referring to FIG. 7, the organic light emitting diode display device according to a fourth embodiment of the present disclosure includes a fixed layer 500 which is formed only in the inner region of the edge of the insulation film 113. The upper surface of the fixed layer 500 does not overlap with the second passivation layer 116. Also, the outer side surface of the fixed layer 500 is not in contact with the insulation film 113. On the other hand, the outer side surface of the fixed layer 500 can be in contact with the second passivation layer.

The element substrate 100 can be defined into a display area DA and a non-display area NA. The display area DA can be defined into a plurality of pixel regions and covered with the insulation film 113. The non-display area NA can be defined as an outer area surrounding the display area DA. In this case, the fixed layer 500 can be formed only in the display area DA. Also, the upper surface of the fixed layer 500 can be formed in an uneven structure, like those of the second and third embodiments. Moreover, the fixed layer 500 can be formed by expanding the first electrode 112.

Figure 8:
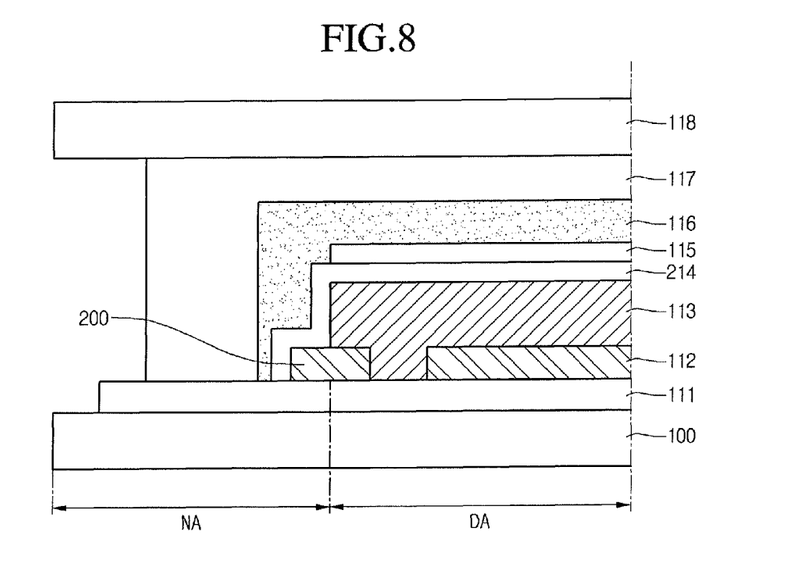
FIG. 8 is a cross-sectional view showing an organic light emitting display device according to a fifth embodiment of the present disclosure.

FIG. 8 is a cross-sectional view showing an organic light emitting display device according to a fifth embodiment of the present disclosure. The organic light emitting diode display device of the fifth embodiment has the similar configuration to that of the first embodiment. As such, the description of the fifth embodiment overlapping with that of the first embodiment is omitted.

Referring to FIG. 8, the organic light emitting diode display device according to a fifth embodiment of the present disclosure includes an organic layer 214 formed to expand to a side surface of the insulation film 113. The organic layer 214 is formed in inner and outer regions of the edge of the insulation film 113.

A fixed layer 250 is formed under the edge of the insulation film 113. The fixed layer 600 can be formed in direct contact with the insulation film 113. The fixed layer 250 under the edge of the insulation film 113 can be formed to expand outwardly from the insulation film 113. In other words, the fixed layer 600 can be formed in inner and outer regions of the edge of the insulation film 113.

The organic layer 214 and the fixed layer 250 are formed in the inner and outer regions based on the edge of the insulation film 113. As such, the organic layer 214 and the fixed layer 250 can be formed in such a manner as to partially overlap with each other in the non-display area NA.

The fixed layer 250 can be formed to have an upper surface of an uneven structure, like those of the second and third embodiments. Also, the fixed layer 250 can be formed by expanding the first electrode 112.

Figure 9:
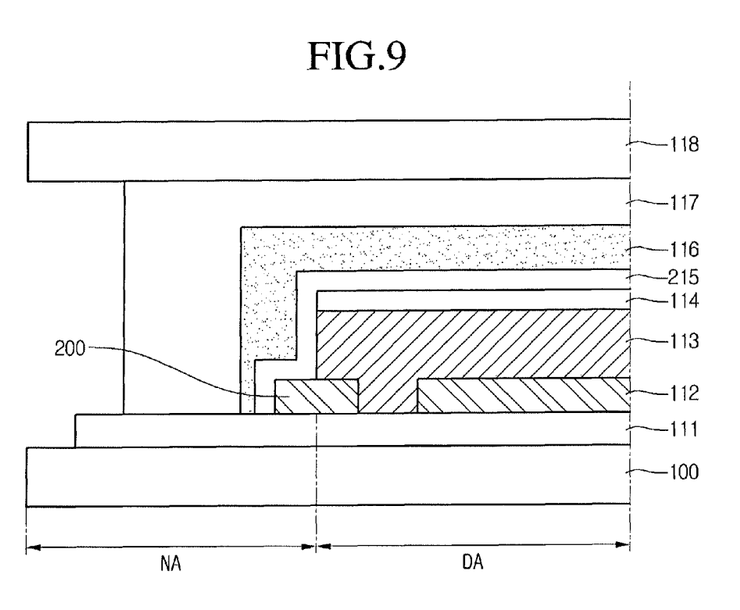
FIG. 9 is a cross-sectional view showing an organic light emitting display device according to a sixth embodiment of the present disclosure.

FIG. 9 is a cross-sectional view showing an organic light emitting display device according to a sixth embodiment of the present disclosure. The organic light emitting diode display device of the sixth embodiment has the similar configuration to that of the first embodiment. As such, the description of the sixth embodiment overlapping with that of the first embodiment is omitted.

Referring to FIG. 9, the organic light emitting diode display device according to a sixth embodiment of the present disclosure includes a second electrode 215 formed to expand to a side surface of the insulation film 113. The second electrode 215 can be formed in inner and outer regions of the edge of the insulation film 113.

A fixed layer 280 is formed under the edge of the insulation film 113. The fixed layer 280 can come in direct contact with the insulation film 113. The fixed layer 280 under the edge of the insulation film 113 can be formed to expand outwardly from the insulation film 113. In other words, the fixed layer 280 can be formed in inner and outer regions of the edge of the insulation film 113.

The second electrode 215 and the fixed layer 280 are formed in the inner and outer regions based on the edge of the insulation film 113. As such, the second electrode 215 and the fixed layer 280 can be formed in such a manner as to overlap with each other in the non-display area NA.

Figure 10:
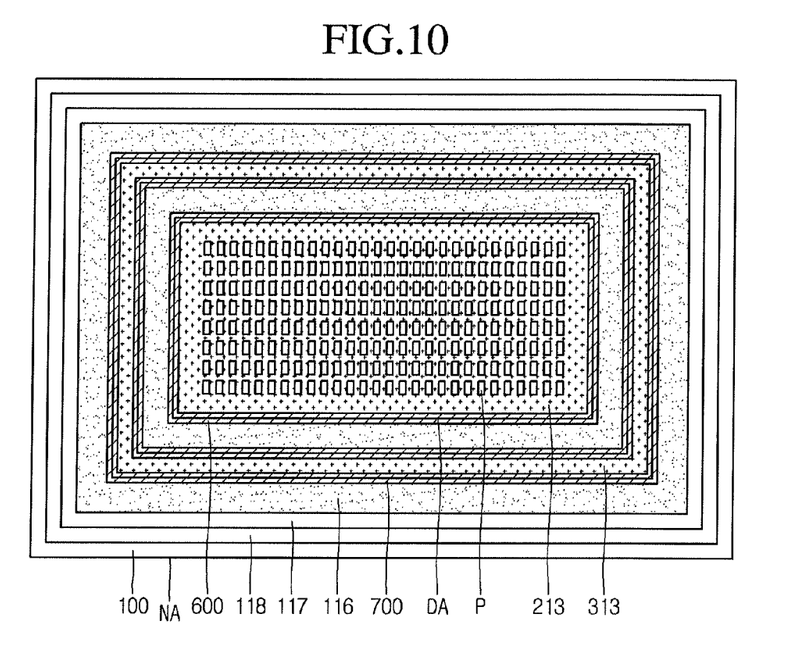
FIG. 10 is a plan view showing an organic light emitting display device according to a seventh embodiment of the present disclosure.

FIG. 10 is a planar view showing an organic light emitting display device according to a seventh embodiment of the present disclosure. Referring to FIG. 10, the organic light emitting diode display device according to a sixth embodiment of the present disclosure includes the element substrate 100 and the sealing substrate 118 which are combined with each other with having the adhesive layer 117 therebetween as shown in FIG. 4. The element substrate 100 can be defined into a plurality of pixel regions P. A first insulation film 213 is formed on the element substrate 100. The first insulation film 213 can partially expose a first electrode of an organic light emitting diode and define the pixel region P.

The element substrate 100 can be defined into a display area DA and a non-display area NA. The display area DA is defined into the plurality of pixel regions P and covered with the first insulation film 213. The non-display area NA can be defined as an outer area surrounding the display area DA.

A first fixed layer 600 is formed under the first insulation film 213. The first fixed layer 600 is formed in direct contact with the first insulation film 213. More specifically, the first fixed layer 600 can be formed under the edge of the first insulation film 213. The edge of the first insulation film 213 corresponds to a boundary of the display area DA and the non-display area NA. In other words, the first fixed layer 600 positioned under the edge of the first insulation film 213 can be formed in a closed loop and surround the display area DA.

More specifically, a part of the first fixed layer 600 can be formed in such a manner as to overlap with first the insulation film 213, and the rest of the first fixed layer 600 can be formed to expand outwardly from the edge of the first insulation film 213. In other words, the first fixed layer 600 can be formed in inner and outer regions of the edge of the first insulation film 213. Consequently, the first fixed layer 600 can be formed in both of the display and non-display areas DA and NA.

A second insulation film 313 is formed in the non-display area NA. The second insulation film 313 is formed in such a manner as to be separate from the first insulation film 213. Also, the second insulation film 313 can be formed in a closed loop surrounding the first insulation film 213. Moreover, the second insulation film 313 can be formed in the same layer and from the same material as the first insulation layer 213, through the same process.

One or more second fixed layers 700 are formed under the second insulation film 313. In this embodiment, two second fixed layers 700 are provided. In another embodiment, a second fixed layer 700 formed as a single body is provided. The second fixed layers 700 can be formed in direct contact with the second insulation film 313. Also, the second fixed layers 700 can be formed under edges of the second insulation film 313. The edges of the second insulation film 313 correspond to side surfaces and a lower surface of the second insulation film 313. The edges of the second insulation film 313 can be defined into an inner edge and an outer edge. The inner edge of the second insulation film 313 can be opposite to the edge of the first insulation film 213.

The second fixed layers 700 positioned under the inner and outer edges of the second insulation film 313 can be each formed in a closed loop. Also, the second fixed layers 700 positioned under the inner and outer edges of the second insulation film 313 can be formed in a signal body united with each other in such a manner as to be connected to each other. A part of each second fixed layer 700 can overlap with the second insulation film 313, and the rest of each second fixed layer 700 can expand outwardly from the edge of the second insulation film 313. In other words, each of the second fixed layers 700 can be formed in inner and outer regions of the respective edge of the second insulation film 313.

A second passivation layer 116 is formed on the first insulation film 213, which partially covers the first fixed layer 600, and the second insulation film 313 which partially covers the second fixed layers 700. Because the second passivation layer 116 is formed to cover the first and second insulation films 213 and 313, the second passivation layer 116 can overlap with the first fixed layer 600 and the second fixed layers 700. The organic light emitting diode display device with the above-mentioned structure will now be described in detail referring to a cross-sectional view.

Figure 11:
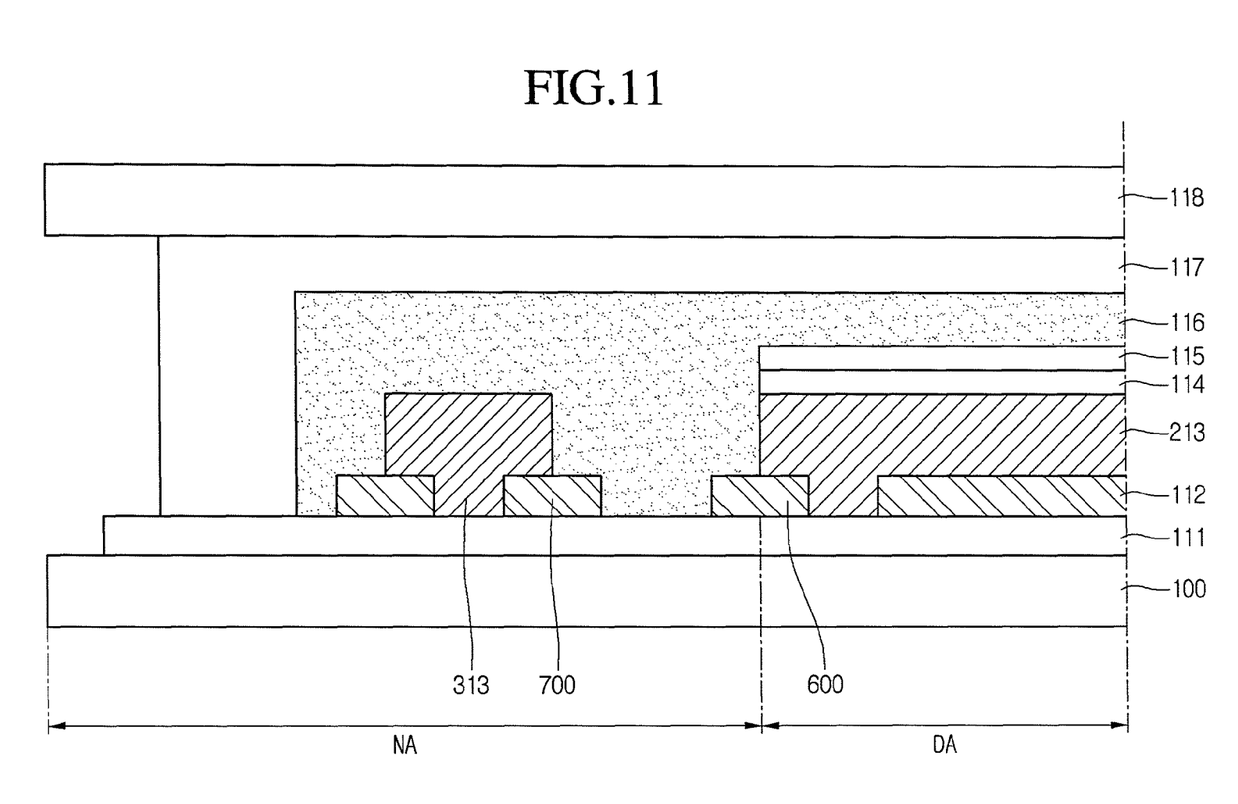
FIG. 11 is a cross-sectional view showing an organic light emitting display device according to a seventh embodiment of the present disclosure.

FIG. 11 is a cross-sectional view showing an organic light emitting display device according to a seventh embodiment of the present disclosure. The organic light emitting diode display device of the seventh embodiment has the similar configuration to that of the first embodiment. As such, the description of the seventh embodiment overlapping with that of the first embodiment is omitted.

Referring to FIG. 11, the first passivation layer 111 is formed on the element substrate 100. The element substrate 100 is defined into a display area DA and a non-display area NA. The display area DA is defined into a plurality of pixel regions P.

An organic light emitting diode is formed on the first passivation layer 111. The organic light emitting diode includes the first electrode 112, the organic layer 114 including at least one light emission layer, and the second electrode 115.

The first insulation film 213 is formed between the first electrode 112 and the organic layer 114. The first insulation film 213 partially exposes the first electrode 112 and defines a light emission region. The exposed portion of the first electrode 112 corresponds to the light emission region, and the rest of the first electrode 112 is defined into a non-light emission region. The organic layer 114 is formed on the first electrode 112 which is exposed by the first insulation film 213.

The second insulation film 313 is formed in the non-display area NA. The second insulation film 313 is formed in such a manner as to be separate from the first insulation film 213. Such a second insulation film 313 can be formed from the same material and in the same layer as the first insulation film 213, through the same process.

The first fixed layer 600 is formed on the first passivation layer 111 under the first insulation film 213. Also, second fixed layers 700 are formed under the second insulation film 313. The first and second fixed layers 600 and 700 can increase an interfacial adhesion force between the first passivation layer 111 and the first and second insulation films 213 and 313. Therefore, a rolling phenomenon of the first and second insulation films 213 and 313 can be prevented.

The first and second fixed layers 600 and 700 can be formed from a metal oxide material. For example, the first and second fixed layers 600 and 700 can be formed from one material selected from a material group which includes indium-tin-oxide ITO, indium-zinc-oxide IZO and zinc-oxide ZnO. Alternatively, the first and second fixed layers 600 and 700 can be formed in the same layer and from the same material as the first electrode 112. Alternatively, or additionally, the first and second fixed layers 600 and 700 can be formed simultaneously as the first electrode 112.

The second passivation layer 116 is formed on the first passivation layer 111 which is provided with the fixed layers 600 and 700, the insulation films 213 and 313 and the organic light emitting diode. The second passivation layer 116 is used to protect the organic light emitting diode from moisture, gas and so on. Also, the second passivation layer 116 can be formed without any crack, the rolling phenomenon of the first and second insulation films 213 and 313 are prevented by the first and second fixed layers 600 and 700.

The first and second fixed layers 600 and 700 positioned under the first and second insulation films 213 and 313 are formed in the inner and outer regions of the edges of the first and second insulation films 213 and 313. As such, the first and second fixed layers 600 and 700 can be formed in such a manner as to contact the second passivation layer 116.

The second fixed layers 700 disposed under the inner and outer edges of the second insulation film 313 can be each formed in the closed loop, as shown in FIG. 10. Alternatively, the second fixed layers 700 disposed under the inner and outer edges of the second insulation film 313 can be formed in a single body, unlike the second fixed layers 700 shown in FIG. 11. Moreover, the organic light emitting diode display device provided with the second fixed layers 700 can be variously changed and modified referring to those of the second through sixth embodiments.

Figure 12A:
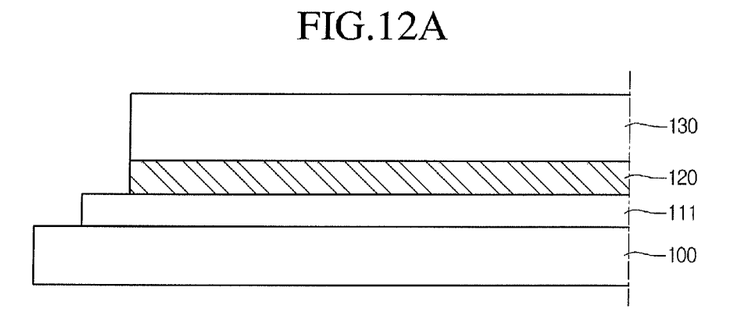
FIGS. 12A through 12C are cross-sectional views illustrating a method of forming a fixed layer of the organic light emitting diode display device according to a first embodiment of the present disclosure.
Figure 12B:
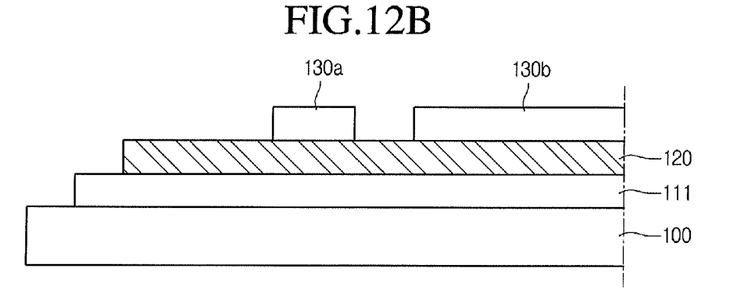
Figure 12C:
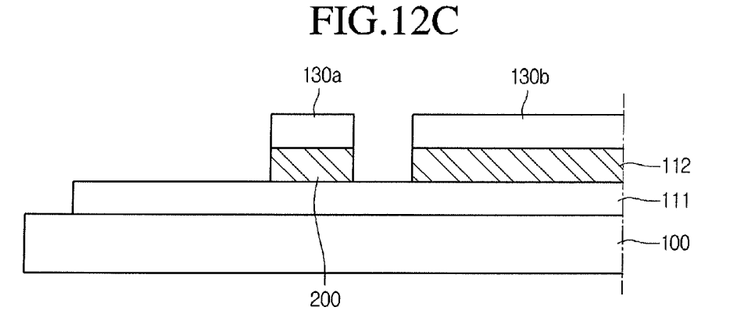

FIGS. 12A through 12C are cross-sectional views illustrating a method of forming a fixed layer in the organic light emitting diode display device according to a first embodiment of the present disclosure. Referring to FIG. 12A, the first passivation layer 111 is formed on the element substrate 100 to protect thin film transistors. Also, a metal oxide film 120 is formed on the first passivation layer 111. The metal oxide layer 120 can be formed from one selected from a material group which includes indium-tin-oxide (ITO), indium-zinc-oxide (IZO), zinc-oxide (ZnO), among others. Moreover, a photo resist layer 130 including a photosensitive material is formed on the metal oxide film 120. The photo resist layer 130 can be formed from a negative photo resist. The negative photo resist corresponds to a photosensitive material which is cured when light is irradiated. Alternatively, a positive photo resist, which becomes soft when light is irradiated, can be used in the formation process of the photo resist layer 130.

Subsequently, a mask (not shown) including an interception portion and transmission portions is disposed over the photo resist layer 130. Also, light is irradiated to the photo resist layer 130 via the transmission portions of the mask opposite to regions in which the fixed layer and the first electrodes will be formed. Continuously, an ashing process is performed for the photo resist layer 130. As such, photo resist patterns 130a and 130b remaining in the formation regions of the fixed layer and the first electrodes are formed on the metal oxide film 120, as shown in FIG. 12B.

Thereafter, an etching process using the photo resist patterns 130a and 130b as an etch mask is performed for the metal oxide film 120. In accordance therewith, the fixed layer 200 and the first electrodes 112 are simultaneously formed from the metal oxide film, as shown in FIG. 12C. The fixed layer 200 enhances an interfacial adhesion force between the first passivation layer 111 and an insulation film which will be formed later. As such, a rolling phenomenon of the insulation film 113 can be prevented. The fixed layer 200 can be formed to be separated from the first electrode 112. Alternatively, the fixed layer 200 can be formed to be connected to the first electrodes 112 even though it is not shown in the drawings. In this case, the fixed layer 200 can be formed from the same material as the first electrode 112 by extending the first electrodes to an edge of the first passivation layer 111.

FIGS. 13A through 13D are cross-sectional views illustrating a method of forming a fixed layer of the organic light emitting diode display device according to the second embodiment of the present disclosure as shown in FIG. 5 above. The fixed layer 300 of the organic light emitting diode display device according to the second embodiment of the present disclosure can be formed to have an uneven upper surface.

Figure 13A:
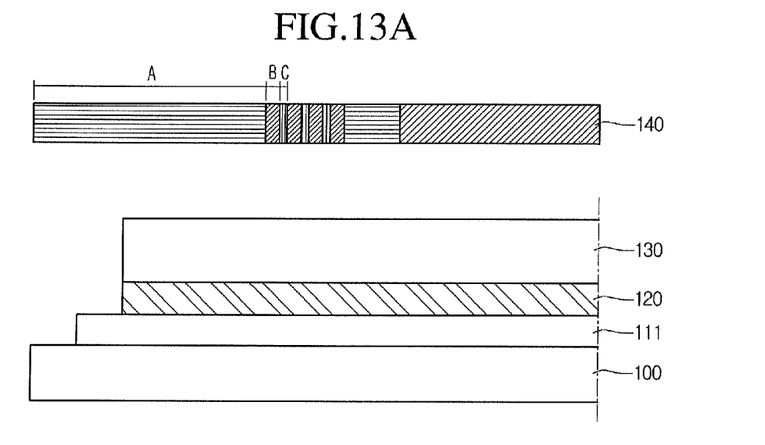
FIGS. 13A through 13D are cross-sectional views illustrating a method of forming a fixed layer of the organic light emitting diode display device according to a second embodiment of the present disclosure.

Referring to FIG. 13A, the first passivation layer 111 is formed on an element substrate 100 to protect thin film transistors, similar to the first embodiment. Also, the metal oxide film 120 is formed on the first passivation layer 111. The metal oxide layer 120 can be formed from one selected from a material group which includes indium-tin-oxide (ITO), indium-zinc-oxide (IZO), zinc-oxide (ZnO), among others. Moreover, the photo resist layer 130 including a photosensitive material is formed on the metal oxide film 120. The photo resist layer 130 can be formed from a negative photo resist. The negative photo resist corresponds to a photosensitive material which is cured when light is irradiated. Alternatively, a positive photo resist, which becomes soft when light is irradiated, can be used in the formation process of the photo resist layer 130.

Thereafter, photo resist patterns can be formed using a half tone mask 140, unlike those of the first embodiment. The half tone mask 140 includes an interception portion A, transmission portions B and semi-transmission portions C. The transmission portion B allows light to be transmitted as it is. The semi-transmission portion C enables light to be transmitted less than the transmission portion B. The interception portion A completely shields light. The half tone mask 140 is disposed over the photo resist layer 130. At this time, the transmission portions B are positioned opposite regions in which the first electrodes will be formed, and the transmission portions B and the semi-transmission portions C alternated with each other are positioned opposite a region in which the fixed layer 300 will be formed. Light is irradiated to the photo resist layer 130 through the transmission and semi-transmission portions B and C of the half tone mask 140.

Figure 13B:
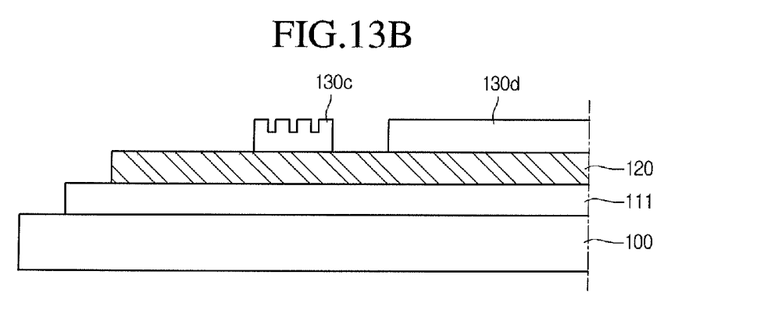

In the region where the fixed layer will be formed, the negative photo resist opposite to the transmission portion B of the half tone mask 140 has a high height because of being cured by light irradiated through the transmission portion B, as shown in FIG. 13B. Also, the negative photo resist opposite to the semi-transmission portion C of the half tone mask 140 within the region, where the fixed layer will be formed, has a lower height because of being half-cured by light irradiated through the semi-transmission portion of the half tone mask 140. In other word, an uneven photo resist pattern 130c can be formed on the region where the fixed layer will be formed. First planarized photo resist patterns 130d can be formed to have a high height on the region where the first electrodes will be formed. Meanwhile, the negative photo resist opposite to the interception portion A of the half tone mask 140 is removed and exposes the metal oxide film 120.

Figure 13C:
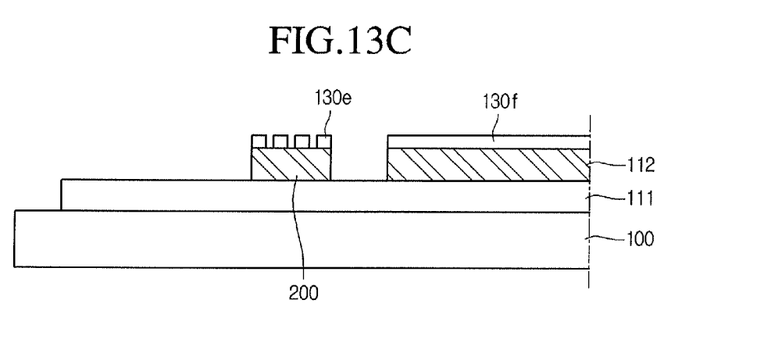

As shown in FIG. 13C, the metal oxide film 120 is patterned by performing an etching process using the uneven and first planarized photo resist patterns 130c and 130d as an etch mask. As such, the first electrodes 112 and a fixed layer 200 can be formed in the same shape as those of the first embodiment.

Subsequently, an ashing process is performed for the photo resist patterns 130c and 130d. As such, the photo resist of the uneven photo resist pattern 130c with the low height is completely removed from the fixed layer, but the photo resist of the uneven photo resist pattern 130c with the high height and the planarized photo resist patterns 130d remain on the fixed layer 200. In accordance therewith, a slit photo resist pattern 130e and second planarized photo resist patterns 130f can be formed on the fixed layer 200 and the first electrodes 112. The slit photo resist pattern 130e partially exposes the fixed layer 200.

Figure 13D:
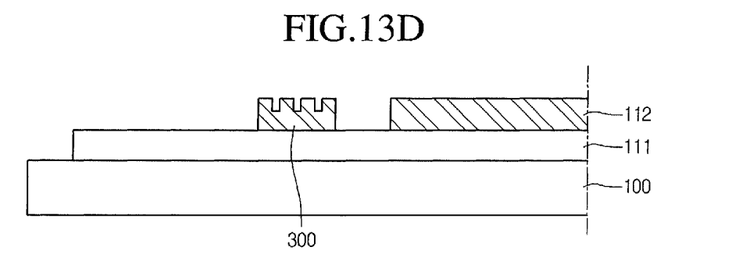

Referring to FIG. 13D, the exposed portions of the fixed layer 200 is etched by a fixed depth using the slit photo resist pattern 130e and the second planarized photo resist patterns 130f as an etch mask. The slit photo resist pattern 130e and the second planarized photo resist patterns 130f are removed from the element substrate 100. As such, the fixed layer 300 with an uneven upper surface can be formed. The fixed layer 300 with the uneven upper surface can increase an adhesion force with an insulation film which will be formed later. This results from the fact that the contact area of the fixed layer 300 and the insulation film become enlarged. In accordance therewith, an effect of preventing a rolling phenomenon of the insulation film can be maximized. Also, the fixed layer 300 can be formed in such a manner as to be separated from the first electrodes 112. Although it is not shown in the drawings, the fixed layer 300 can be formed in such a manner as to be connected to the first electrodes 112. In this case, the fixed layer 300 can be formed from the same material as the first electrodes 112 by extending the first electrodes 112 to the edge of the first passivation layer 111.

Figure 14B:
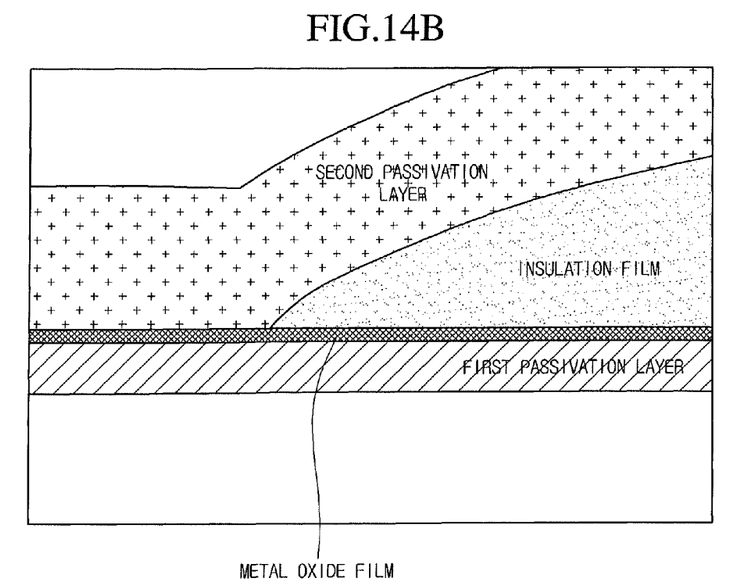
FIG. 14B illustrates one example of an experimental resultant for a rolling phenomenon which can be generated in an organic light emitting diode display device according to an embodiment of the present disclosure.

FIG. 14A is a cross-sectional view illustrating a rolling phenomenon which is generated in an organic light emitting diode display device of the related art. FIG. 14B is a cross-sectional view illustrating an experimental result of an organic light emitting diode display device according to an embodiment of the present disclosure.

Referring to FIG. 14A, the organic light emitting diode display device has a weak interfacial adhesion force between the insulation film and the first passivation layer on the element substrate. As such, a rolling phenomenon of the insulation film can be generated. The rolling phenomenon of the insulation film 13 causes the second passivation layer not only to be rolled up but also to generate a crack. Due to this, the organic light emitting diodes and the other components cannot be protected against moisture, gas, among others. Therefore, the reliability of the organic light emitting diode display device becomes deteriorated.

As shown in FIG. 14B, the organic light emitting diode display device according to an embodiment of the present disclosure allows the fixed layer including a metal oxide film to be formed under the edge of the insulation film. As such, an adhesion force of the first passivation layer and the insulation film can be enhanced. In accordance therewith, a rolling phenomenon of the insulation film can be prevented. As a result, cracks are not generated in the second passivation layer, and furthermore the reliability of the organic light emitting diode display device can be enhanced.

As described above, the organic light emitting diode display device and the fabricating method thereof according to embodiments of the present disclosure allow the fixed layer to be formed on the first passivation layer under the edge of the insulation film. As such, not only the rolling phenomenon of the insulation film but also the crack generation in the second passivation layer can be prevented. The contractive property of the organic light emitting diode display device can be enhanced. Moreover, display components can be protected from the intrusion of moisture because the intrusion paths for external moisture can be blocked up.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

What is claimed is:

1. An organic light emitting diode display device comprising:
    a substrate configured to include a plurality of pixel regions;
    a first passivation layer arranged above the substrate;
    an organic light emitting diode formed on the first passivation layer and including:
        a first electrode formed on the first passivation layer,
        a first insulation film formed on the first electrode and defining an emission region;
        an organic layer; and
        a second electrode of the organic light emitting diode formed on the organic layer;
    a first adhesion enhancement pattern arranged at an end portion or an edge of the first insulation film and disposed on the first passivation layer such that the end portion of the first insulation film avoids contacting the first passivation layer; and
    a second passivation layer configured to cover the organic light emitting diode.

2. The organic light emitting diode display device of claim 1, wherein the first adhesion enhancement pattern extends from the end portion or the edge of the first insulation film and contacts the second passivation layer.

3. The organic light emitting diode display device of claim 1, wherein the first passivation layer contacts the first insulation film between the first electrode and the first adhesion enhancement pattern.

4. The organic light emitting diode display device of claim 1, wherein the first adhesion enhancement pattern extends without contacting the second passivation layer.

5. The organic light emitting diode display device of claim 1, wherein the first adhesion enhancement pattern comprises a metal oxide material.

6. The organic light emitting diode display device of claim 1, wherein the first adhesion enhancement pattern comprises the same material as that of the first electrode.

7. The organic light emitting diode display device of claim 1, wherein the first adhesion enhancement pattern comprises an uneven upper surface.

8. The organic light emitting diode display device of claim 7, wherein the uneven upper surface of the first adhesion enhancement pattern comprises a plurality of slits.

9. The organic light emitting diode display device of claim 1, wherein the first passivation layer and the second passivation layer enclose the first adhesion enhancement pattern and the organic light emitting diode therebetween.

10. The organic light emitting diode display device of claim 1, wherein the first electrode extends toward an end portion or an edge of the first insulation film to form the first adhesion enhancement pattern such that the end portion or the edge of the first insulation film avoids contacting the first passivation layer.

11. The organic light emitting diode display device of claim 1, further comprises:
    a second insulation film formed on the first passivation layer opposite to the first insulation film and spaced apart from the first insulation film; and
    a second adhesion enhancement pattern arranged at an end portion or an edge of the second insulation film and disposed on the first passivation layer such that the end portion of the second insulation film avoids contacting the first passivation layer.

12. The organic light emitting diode display device of claim 11, wherein the second insulation film is formed in a closed loop surrounding the first insulation film.

13. The organic light emitting diode display device of claim 11, wherein the first adhesion enhancement pattern and the second adhesion enhancement pattern comprise the same material as that of the first electrode.

14. A method of fabricating an organic light emitting diode display device, the method comprising:

forming an element substrate which includes a plurality of pixel regions;
forming a first passivation layer on the element substrate;
forming a first electrode of an organic light emitting diode on the first passivation layer;
forming a first adhesion enhancement pattern on the first passivation layer such that the end portion or the edge of a first insulation film avoids contacting the first passivation layer;
forming a first insulation film on the first electrode;
forming an organic layer on the insulation film;
forming a second electrode of the organic light emitting diode on the organic layer; and
forming a second passivation layer on the second electrode.

15. The method of claim 14, wherein forming the first adhesion enhancement pattern comprises forming an upper surface of the first adhesion enhancement pattern to have an uneven structure using a half tone mask.

16. The method of claim 14, wherein forming the first adhesion enhancement pattern comprises forming the first adhesion enhancement pattern from the same material as the first electrode.

17. The method of claim 14, wherein forming the first adhesion enhancement pattern comprises forming the first adhesion enhancement pattern simultaneously with the first electrode.

18. The method of claim 14, further comprising patterning the first adhesion enhancement pattern which is initially connected with the first electrode from the first electrode.

19. The method of claim 14, wherein forming the first adhesion enhancement pattern comprises extending the first electrode toward the end portion or the edge of the first insulation film to form the first adhesion enhancement pattern.

20. The method of claim 14, wherein forming the first adhesion enhancement pattern comprises forming a second adhesion enhancement pattern simultaneously with the first adhesion enhancement pattern,
wherein forming the first insulation film comprises forming a second insulation film on the second adhesion enhancement pattern in a position opposite to the first insulation film and spaced apart from the first insulation film, and
wherein the second adhesion enhancement pattern arranged at an end portion or an edge of the second insulation film and disposed on the first passivation layer such that the end portion of the second insulation film avoids contacting the first passivation layer.

21. The method of claim 20, wherein forming the first adhesion enhancement pattern and the second adhesion enhancement pattern comprises forming the first adhesion enhancement pattern and the second adhesion enhancement pattern from the same material as the first electrode.

22. The method of claim 20, wherein forming the first adhesion enhancement pattern and the second adhesion enhancement pattern comprises forming the first adhesion enhancement pattern and the second adhesion enhancement pattern simultaneously with the first electrode.

* * * * *